(12) United States Patent
Bracmard

(10) Patent No.: US 6,597,749 B1  
(45) Date of Patent: Jul. 22, 2003

(54) DIGITAL FREQUENCY MONITORING

(75) Inventor: Gaetan J. J. Bracmard, Fuveau (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 09/444,001

(22) Filed: Nov. 19, 1999

(51) Int. Cl.$^7$ ............................................... H03D 1/00
(52) U.S. Cl. ...................................................... 375/342
(58) Field of Search ................................ 375/340, 342, 375/259, 374, 375, 377, 239; 327/26, 18, 31, 171, 291, 172; 348/521; 320/129

(56) References Cited

U.S. PATENT DOCUMENTS

| | | | |
|---|---|---|---|
| 3,735,271 A | 5/1973 | Leibowitz | 328/112 |
| 3,906,247 A | 9/1975 | Heffner | 307/293 |
| 4,024,414 A | 5/1977 | Gurry | 307/233 |
| 4,223,270 A | 9/1980 | Schmid et al. | 328/112 |
| 4,604,536 A | 8/1986 | Clutterbuck et al. | 307/603 |
| 4,959,557 A | 9/1990 | Miller | 307/265 |
| 5,124,597 A | 6/1992 | Stuebing et al. | 307/601 |
| 5,283,515 A | 2/1994 | Jordan | 323/288 |
| 5,469,287 A | 11/1995 | Iwakuni | 359/189 |
| 5,847,833 A | 12/1998 | Yokoyama et al. | 356/375 |
| 5,923,191 A | 7/1999 | Nemetz et al. | 327/20 |

FOREIGN PATENT DOCUMENTS

| | | |
|---|---|---|
| JP | 59005737 | 12/1984 |
| JP | 01175409 | 11/1989 |

*Primary Examiner*—Emmanuel Bayard  
(74) *Attorney, Agent, or Firm*—Thomas Schneck

(57) ABSTRACT

A pulse monitoring circuit monitors the pulse length of both the logic high pulse and logic low pulse of a received digital sequence. The pulse lengths are compared with a preferred transition window, and if the pulses transition within the preferred transition window then they are categorized as good pulses. The pulse monitoring circuit issues an enable signal only when at least two consecutive good pulses are received. The pulse length is determined by means of a reference voltage, a first faster linear voltage ramp, and a second slower linear voltage ramp. The two linear voltage ramps are initiated in response to a logic change of the received digital sequence and continue to raise their outputs until the received digital sequence changes state once again. The values of the two linear voltage ramps at the time of the second state change are compared with the reference voltage. If the faster linear voltage ramp is above the reference voltage and the slower linear voltage ramp is below the reference voltage, then the observed pulse of the digital sequence is determine to have transitioned within its preferred transition window.

44 Claims, 4 Drawing Sheets

DIGITAL FREQUENCY MONITORING

TECHNICAL FIELD

This invention relates to pulse monitoring systems and in particular to systems for detecting the pulse width of received signals.

BACKGROUND ART

Transmitted digital signals need their pulse widths to remain within a prescribed tolerance in order for the receiving circuitry to be able to ascertain the data content of the transmitted signals. A transmitted digital signal may become distorted by frequency response effects of the transmitting medium, by loss of energy over distance, electromagnetic interference, etc.

With reference to FIG. 1, two sample pulse sequences are shown. Both begin with a logic low and transition to a logic high. In the case of a logic low, TLmin denotes the minimum allowed pulse length of a logic low pulse and TLmax denotes the maximum allowed pulse length for a logic low pulse. In order for a receiving circuit to accept a logic low to high transition, the incoming pulse low signal should transition within a window of time defined by the difference of TLmax and TLmin. This window of time is defined as logic low transition window, W0, in FIG. 1. Similarly, a logic high pulse also needs to have a pulse length defined by a minimum logic high pulse length, THmin, and a maximum logic high pulse length, THmax. In order for a logic high to low transition to be accepted, the transition should occur within a window of time defined by the difference of THmax and THmin. This window of time is defined as a logic high transition window, W1. As shown with the two sample pulse sequences of FIG. 1, the time windows W0 and W1 need not be the same for different applications, although they typically should remain constant within a single application.

The receiving circuit includes a pulse detecting sub-circuit to observe the pulse length of received pulse signals. Prior art pulse detecting circuit typically observe only one of the logic high or logic low pulse of a received signal, but not both. This means that the pulse detecting circuit cannot determine the signal period of the received pulse signal, and thus cannot observe shifts in the signal's frequency. Frequency shifts in a received pulse signal can therefore lead to undetected errors.

Prior art pulse detecting circuits typically use two one-shot circuits to determine if a received signal is valid for a predetermined transition window. Both one-shot circuits are typically triggered on the leading edge of an received pulse signal. A first one-shot circuit issues a first pulse having a length equal to the minimum pulse length requirement, and the second one-shot circuit issues a second pulse having a length equal to the maximum pulse length requirement. At the end of the second pulse, the received signal is compared with the first and second pulse. If the length of the received pulse does not lie within the first and second pulse, then no detection signal is issued and the received pulse signal is ignored. One shot-circuits, however, are difficult to control or adjust in integrated circuitry. Additionally, they do not provide for a simple way of adjusting the required transition window for different applications.

This prior art approach can also slow down a system since the pulse detecting circuit waits for the lapse of the maximum pulse length before verifying the received pulse signal. In effect, it waits the maximum amount of delay time for each received pulse signal even if the received pulse signal transition earlier and do not require any additional wait time. U.S. Pat. No. 3,735,271 to Leibowitz shows a pulse width detecting circuit that does not wait for the maximum allowable pulse length before testing for a valid received pulse signal. The '271 circuit, however, requires three one-shot circuits and adds a delay to each received pulse signal. This added delay may actually cause additional errors. Assuming the circuit receives a pulse signal having a pulse length slightly shorter than the minimum require pulse length, the added pulse delay introduced by '271 may actually cause the circuit to think that the received signal did meet the minimum pulse length requirement.

It is an object of the present invention to provide a pulse detecting circuit that observes both a received pulse signal's pulse length and its frequency.

It is another object of the present invention to provide a pulse detecting circuit that observes both logic high and logic low pulse of a received pulse signal.

It is yet another object of the present invention to provide a pulse detecting circuit that lends itself to simple integration onto an IC circuit and that permits its allowable pulse transition windows W0 and W1 to be independently, or jointly, adjusted from inside and from outside the IC circuit.

SUMMARY OF THE INVENTION

The above objects are met in a pulse detection circuit that uses a pair of linear voltage ramp generators and a reference voltage source for establishing a preferred pulse length window for a received pulse signal. The present pulse detection circuit monitors both the positive duty cycle and the negative duty cycle of a received pulse signal. Therefore, it can detect frequency shifts in the received pulse signals. If a positive or negative duty cycle is found to be either too short or too long, it is categorized a "bad" duty cycle and an error signal is issued that disables the internal circuitry of a chip. If the duty cycle lies within a predetermined time window, i.e. a preferred pulse transition window, it is categorized as a "good" duty cycle. If an error signal is issued due to encountering a bad duty cycle, the internal circuitry of the chip remains disabled until two consecutive good duty cycles are observed. When the present pulse detection circuit receives two consecutive good pulses, i.e. good high pulse following a good low pulse, or a good low pulse following a good high pulse, it issues an enable signal to re-enable the internal circuitry of the chip.

The present duty cycle monitoring circuit includes two monitoring sub-circuits. A first sub-circuit monitors the positive duty cycle of an incoming pulse signal, and a second sub-circuit monitors the negative duty cycle of the incoming pulse signal. Since the positive and negative duty cycles are monitored by separate sub-circuits, the present pulse detection circuit can support different preferred pulse transition windows for positive duty cycles and for negative duty cycles. For the sake of brevity, only the first sub-circuit for monitoring a positive duty cycle described here. The circuit structure for the second sub-circuit is similar to the first sub-circuit and is discussed in detail in the best mode description below.

A preferred pulse transition window, W1, for a "good" positive duty cycle is first defined. This pulse transition window is established by means of a slower linear voltage ramp and a faster linear voltage ramp working in unison. As time passes, the voltage difference between the slower and faster linear voltage ramps increases, and this voltage difference becomes a measure of the a duty cycle duration. A desired duration window is established by noting the voltage value of the slower linear voltage ramp when the voltage difference between the slower and faster linear voltage ramps becomes representative of the desired pulse transition window. This noted voltage value becomes a reference voltage to which an incoming clock is compared. In other words, the length of a pulse transition window can be adjusted or shifted in time by changing the reference voltage or by adjusting the slope of the linear voltage ramp generators. The reference voltage may be generated from within the circuit or may be supplied from a source external to the circuit.

As logic state of an incoming clock changes from low to high, the slower and faster voltage ramps are reset and re-triggered. A first comparator is used to compare the rising voltage value of the faster voltage ramp with the reference voltage. The first comparator signals when the faster voltage ramp rises above the reference voltage. A second comparator is used to compare the rising voltage value of the slower voltage ramp with the same reference voltage. The second comparator signals when the slower ramp rises above the reference voltage. The received pulse signal is within the desired pulse length while only while the faster voltage ramp is above the reference voltage and the slower voltage ramp is below the reference voltage. If either comparator indicates that these conditions are not true, then the duty cycle of the incoming clock is outside the desired window and it is categorized as a "bad" duty cycle.

Upon the trailing edge of the received pulse, the output of the comparators is analyzed and the result stored in a first register. A second register stores the result of the previous received pulse. The state, good or bad, of the current pulse is compared with the state, good or bad, of the previous pulse. If the state the current pulse is bad, then a disable signal is issued. If the state of the current pulse is good, but the state of the previous pulse is bad, then the disable signal remains issued. If the state of the current pulse and the previous pulse are both good, then an enable signal is issued.

Additionally, included is an initiation circuit that maintains a constant disable signal during the first few received pulse signals at start-up. This gives the internal circuitry time to achieve a known state before being enabled by the pulse detecting circuit.

BEST MODE FOR CARRYING OUT THE INVENTION

The present pulse monitoring circuit uses two pulse detecting sub-circuit to monitor both the positive duty cycle an the negative duty cycle of incoming pulse signals. By monitoring both the positive duty cycle and the negative duty cycle, the present pulse monitoring circuit can deter- mine if the overall signal period of a received pulse signal is within predetermined minimum and maximum period time lengths. By noting shifts in the period of received pulse signals, the present pulse monitoring circuit can likewise make note of shifts in the frequency of received pulse signals.

Figure 1:
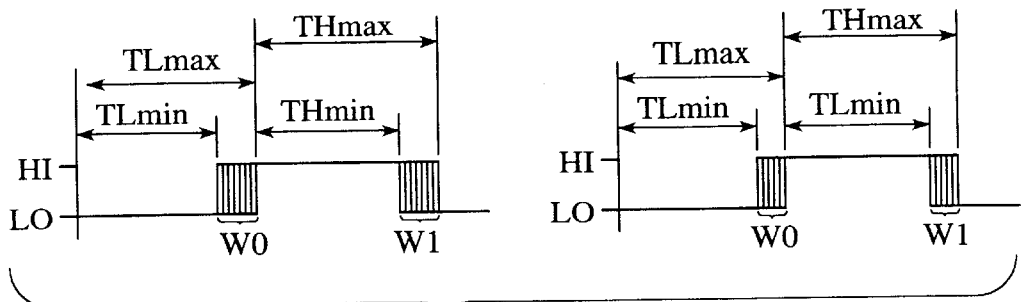
FIG. 1 illustrates the variation in pulse width of a digital signal.
Figure 2:
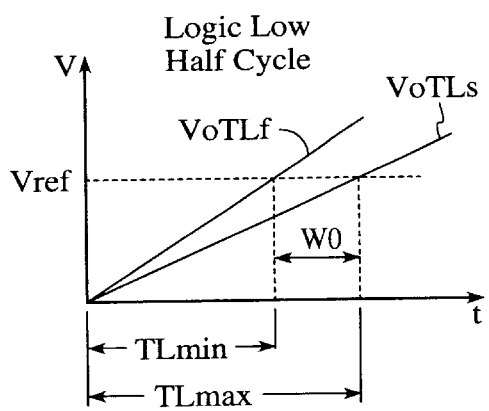
FIGS. 2 & 3 show the relationship of between two linear voltage ramps.

With reference to FIG. 2, each of the two pulse detecting sub-circuits uses a pair of linear voltage ramps to measure the pulse duration of a received logic pulse signal. Plots VoTLf and VoTLs show exemplary outputs of two linear voltage ramp generators used for observing a received logic low pulse. The logic low pulse detecting sub-circuit includes a slower linear voltage ramp generator producing output VoTLs and a faster linear voltage ramp generator producing output VoTLf. Both the faster and slower linear voltage ramps are reset upon receipt of a logic low pulse and begin to ramp up at a predetermined voltage/second rate. This rate may be adjusted by adjusting the strength, i.e. current sourcing capability, of the individual linear voltage ramp generators. A reference signal Vref sets the maximum allowable time TLmax for a logic low pulse and also sets the minimum allowable time TLmin for a logic low pulse. The TLmin time limit is set at the intersection of Vref with VoTLf, and the TLmax time limit is set at the intersection of Vref with VoTLs. As shown, the minimum time duration TLmin for a logic low pulse is determined by the faster linear voltage ramp VoTLf, and the maximum time duration TLmax for a logic low pulse is determined by the slower linear voltage ramp VoTLs. The difference between TLmax and TLmin defines the time boundaries for a desired logic low transition window W0. The with of W0 may be adjusted by raising or lower Vref, or by changing the slope of one or both of VoTLf and VoTLs. If a received logic low pulse transitions to a logic high within the transition window defined by W0, it is categorized as a "good" received pulse, but if it transitions outside W0, then it is categorized as a "bad" received pulse.

Figure 3:
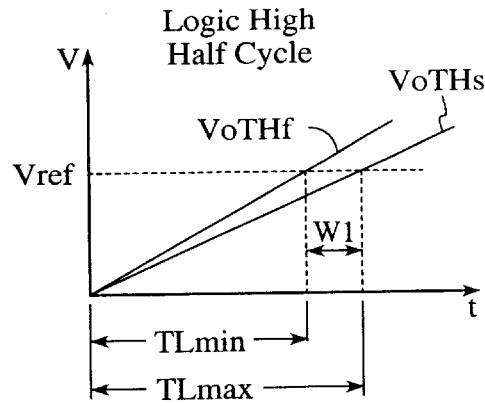

With reference to FIG. 3, exemplary plots of linear voltage ramps VoTHs and VoTHf used for monitoring the logic high pulse length of a received pulse signal is shown. Signals VoTHs and VoTHf begin to ramp up upon receipt of a logic high pulse. As before, the intersection of the faster voltage ramp VoTHf and reference voltage Vref establishes the minimum time duration TLmin for a pulse width, in this case a positive pulse width. Similarly, the intersection of Vref and the slower linear voltage ramp VoTHs establishes the maximum duration of a positive pulse with. The difference of the maximum allowable pulse duration TLmax and the minimum pulse duration TLmin establish the boundaries for a desired logic high to logic low transition window W1. In the present preferred embodiment, preferred transition window W1 is shorter than W0, but this is not crucial to the invention. In many cases, it may be desirable for W1 and W0 to define a similar time window. It should be noted, however, that both W0 of FIG. 2 and W1 of FIG. 3 are a function of the same reference voltage Vref. Although it is not critical to the invention that both W0 and W1 be responsive to the same reference signal Vref, this is preferred since it simplifies simultaneous control of both W0 and W1. The width of W1 may also be adjusted by adjusting one or both of VoTHf and VoTHs.

Thus the present pulse detecting circuit can detect time deviations in both logic high and logic low cycles, of a received pulse sequence. This permits it detect not only when a logic pulse is outside its preferred transition window, but also when its period, and therefore its frequency, shifts beyond acceptable limits.

Figure 4:
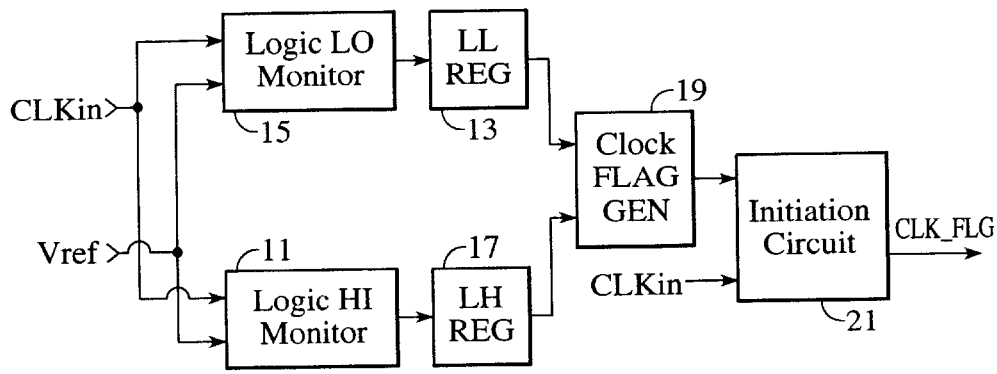
FIG. 4 is a functional block diagram of the present invention.

With reference to FIG. 4, a block diagram of a circuit suitable for implementing the present invention is shown. A logic low monitor block 15 monitors received logic low pulses and a logic high monitor block 11 monitors received logic high pulses. Both logic low and logic high monitor blocks 15 and 11 preferably receive the same reference signal Vref, and both receive a pulse signal, exemplified by received clock signal CLKin.

Each of logic high and logic low monitor blocks 11 and 15 include within themselves a pair of linear voltage ramps and a means for comparing their respective linear voltage ramps with reference signal Vref. For example, logic low monitor block 15 includes a first slower linear voltage ramp generator producing an output VoTLs similar to that shown in FIG. 2, and include a second faster voltage ramp generator producing an output VoTLf also similar to that of FIG. 2. Its first and second linear voltage ramp generators are reset and begin ramping up upon receiving a logic low pulse. Their respective outputs VoTLs and VoTLf continue to ramp up while the received pulse is at a logic low. When the received signal CLKin transitions to a logic high, the values of VoTLf and VoTLs are compared with reference signal Vref. If at the time that CLKin transitioned to a logic high, VoTLf was at a higher potential than Vref and VoTLs was at a lower potential than Vref, then CLKin transitioned within the desired transition window W0. Logic low monitor block 15 will therefore send a "good pulse cycle" signal to a logic low register 13. If, on the other hand, signal VoTLf was not higher than Vref or signal VoTLs not lower than Vref at the time that CLKin transitioned to a logic high, then the logic pulse was ether too short or too long and a "bad pulse cycle" signal would have been sent to logic low register 13. Logic low register 13 stores the result from logic low monitor block 15 until the next logic low pulse cycle and provide the result to a flag generator 19.

Similarly, logic high monitor block 11 includes within itself a third slower linear voltage ramp producing an output VoTHs similar to that shown in FIG. 3 and a fourth faster linear voltage ramp producing an output VoTHf similar to that of FIG. 3. Logic high monitor block 11 also includes a means for comparing VoTHs and VoTHf with reference voltage Vref. When input signal CLKin produces a logic high pulse, third and fourth linear voltage ramps are reset and begin producing respective outputs VoTHs and VoTHf while signal CLKin remains at a logic high. When input CLKin transistions back to a logic low, the values of VoTHf and VoTHs are compared with reference voltage Vref. If at the time that CLKin transitioned to a logic low, VoTHf was at a higher potential than Vref and VoTHs was at a lower potential than Vref, then CLKin transitioned within W1 and a "good pulse cycle" signal is sent to logic high register 17. By contrast, if VoTHf was not higher than Vref or VoTHs was not lower than Vref at the time that CLKin transitioned to a logic low, then the transition was either too long or too short and did not take place within W1. In this case, a "bad pulse cycle" signal would be issued to logic high register 17. Logic high register 17 stores the result of logic high monitor 11 until the next logic high pulse cycle and provides the stored results to flag generator 13.

A clock flag generator 19 compares the result of the most current pulse cycle with that of the previous pulse cycle. If both the current pulse cycle and the previous pulse cycle received a "good pulse cycle" single, then flag generator 19 produces an enable signal. If the current pulse cycle received a "bad pulse cycle" signal, then flag generator 19 will issue a disable signal irrespective of the condition of the previous clock cycle. If the current pulse cycle received a "good pulse cycle" signal, but the previous pulse cycle received a "bad pulse cycle" signal, then a flag generator 19 will produce a disable signal. The enable and disable signals produced by flag generator 19 may be directly applied to other circuits responsive to the present pulse monitoring circuit, or it may be gated by an initiation circuit 21.

Initiation circuit 21 includes a timing means and can selectively transfer the output of flag generator 19 to output signal CLK_FLG for application to other circuits responsive to the present pulse monitoring circuit, or apply a disable signal to output signal CLK_FLG.

Initiation circuit 21 is preferably reserved for start-up conditions. During start-up, the present pulse monitoring circuit and the other circuits responsive to the present pulse monitoring circuit may require a setup period to achieve stable start-up conditions. Initiation circuit 21 therefore provides a wait period at startup to give other circuitry time to reach their stable start-up conditions. During start-up, initiation circuit 21 initiate a wait period by transferring a disable signal onto output lead CLK_FLG for a predetermined amount of time or a predetermined amount of CLKin cycles. At the end of the wait period, initiation circuit 21 then permits the output of flag generator 19 to be freely transferred onto output lead CLK_FLG.

Figure 5:
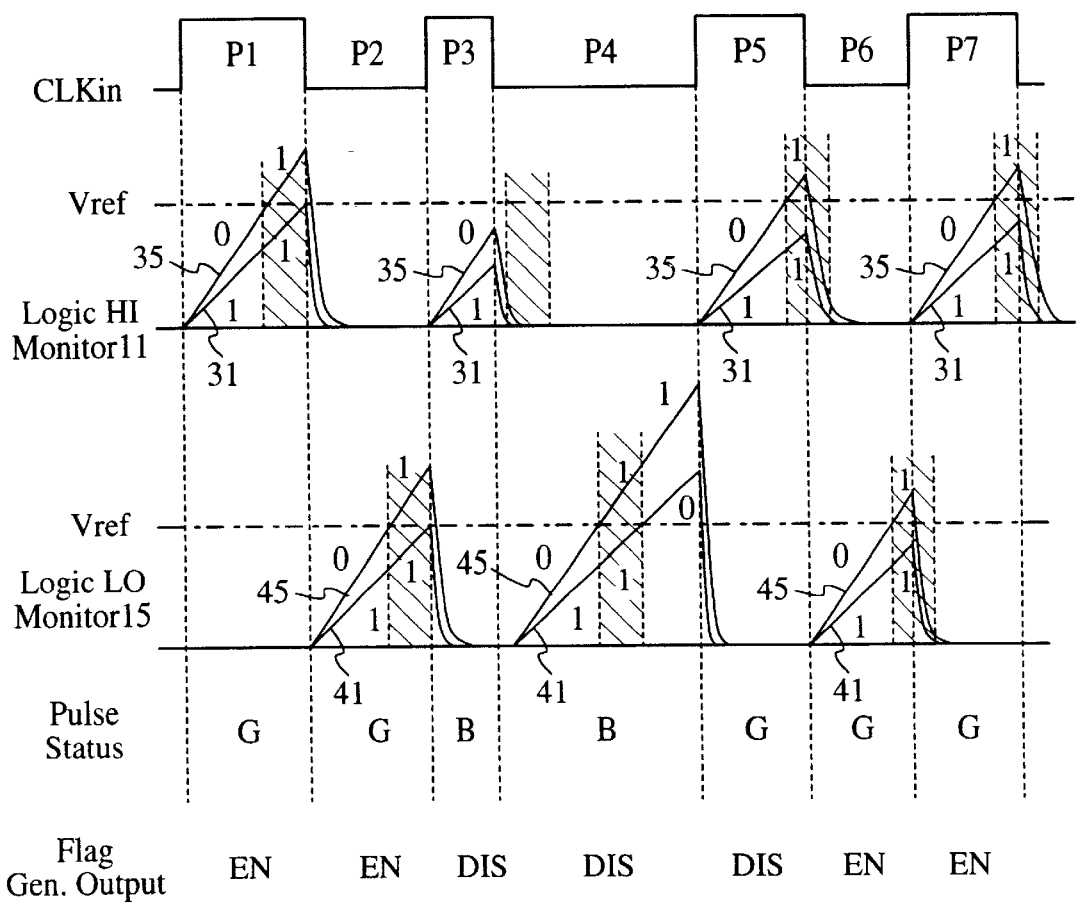
FIG. 5 shows exemplary voltage versus time plots illustrating how the present invention identifies when a pulse signal transistions within a preferred transition window.

With reference to FIG. 5, a graphical example of the interaction of logic high monitor block 11, logic low monitor block 15, reference signal Vref, output of clock flag generator 19, and input pulse signal CLKin is shown. Input signal CLKin is shown to consist of seven logic high and logic low pulses of differing pulse lengths. The interaction of reference signal Vref along with monitor blocks 11 and 15 determine if the pulse lengths of CLKin fall within the predetermined transition windows W0 and W1. Preferred transitions windows W0 and W1 are shown as shaded areas, and numerical values 0 and 1 symbolically denote the result of the means included within each of monitor blocks 11 and 15 for comparing their respective linear voltage ramps with reference voltage Vref.

In FIG. 5, logic high monitor block 11 is shown to use a faster linear voltage ramp 35 and a slower linear voltage ramp 31 to observe logic high pulses P1, P3, P5, and P7 of signal CLKin. As shown, respective linear voltage ramps 31 and 35 begin ramping up upon reception of a logic high pulse of CLKin. The values of linear voltage ramps 31 and 35 are shown continuously compared with reference signal Vref, but it is not critical that linear voltage ramps 31 and 35 be continuously compared with reference signal Vref. It is sufficient that at least the values of linear voltage ramps 31 and 35 at the time that a CLKin logic high pulse ends be compared with reference signal Vref. In the present example, the numbers 0 and 1 above linear voltage ramp 35 correspond to the comparison results of faster linear voltage ramp 35 with reference voltage Vref. A value of 0 indicates that linear voltage ramp 35 is below Vref and a value of 1 indicates that linear voltage ramp 35 is above Vref. Also in the present example, numbers 0 and 1 below slower linear voltage ramp 31 indicate the result of the comparison results of slower linear voltage ramp 31 with reference voltage Vref. A value of 1 indicates that linear voltage ramp 31 is below Vref and a value of 0 indicates that it is above Vref.

Similarly, logic low monitor block 15 is shown to use a faster linear voltage ramp 45 and a slower linear voltage ramp 41 to observe logic low pulses P2, P4, and P6 of signal CLKin. Respective linear voltage ramps 41 and 45 begin ramping up upon reception of a logic low pulse of CLKin. In the present example, linear voltage ramps 41 and 45 are continuously compared with reference signal Vref, but if desired they can be compared with Vref only at the end of a logic low pulse. Like in the previous case, numbers 0 and 1 above linear voltage ramp 45 correspond to the comparison results of faster linear voltage ramp 45 with reference voltage Vref, and numbers 0 and 1 below linear voltage ramp 41 indicate the result of the comparison results of slower linear voltage ramp 41 with reference voltage Vref. As applied to faster linear voltage ramp 45, a comparison value of 0 indicates that it is below Vref and a comparison value of 1 indicates that it is above Vref. In regards to slower linear voltage ramp 41, however, a value of 1 indicates that it is below Vref and a value of 0 indicates that it is above Vref.

Voltage ramps 31, 35, 41 and 45 are shown to be reset at the end of the respective logic high or logic low CKLin pulse that they are observing, but this is not critical to the invention. Voltage ramps 31, 35, 41 and 45 may continue ramping pass the end of the respective logic high or logic low pulse they are observing. They should, however, be reset by the beginning of a new respective logic high or logic low pulse.

With reference to pulses P1 to P7, faster linear voltage ramps 35 and 45 maintain a comparison value of 0 while ramping up until they reach the lower boundary of their respective preferred transition window, indicated by a shaded area. This lower boundary is marked by their respective crossing over reference signal Vref. Faster linear voltage ramps 35 and 45 then maintain a comparison value of 1 once they have achieved values greater than Vref. By contrast, slower linear voltage ramps 31 and 41 maintain a comparison value of 1 while ramping up until they reach the upper boundary of their respective preferred transition window, indicated by the shaded area. This upper boundary is marked by their respective crossing over reference signal Vref. Slower linear voltage ramps 31 and 41 then maintain a comparison value of 0 once they reach values greater than Vref. The choice of whether a value of 1 indicated that a linear voltage ramp is above or below Vref is arbitrary. In the present example, a comparison value of 1 is used with faster linear voltage ramps 35 and 45 to indicate that they are above Vref, while a comparison value of 1 is used with slower linear voltage ramps 31 and 41 to indicate that they are below Vref. This arbitrary choice was made so that the preferred transition regions of monitor blocks 11 and 15 would be denoted by their respective faster and slower linear voltage blocks both having a comparison value of 1 simultaneously.

With reference to logic high pulse P1, logic high monitor block 11 shows that P1 ended while both slower linear voltage ramp 31 and faster linear voltage ramp 35 had a comparison value of 1. Therefore, P1 transitioned within its preferred transition window and it receives a pulse status of G, indicated a "good pulse cycle". Flag generator 19 receives this result and compares it with the previous cycle. In the present example, it is assumed that the previous cycle was also a good pulse cycle and flag generator 19 therefore outputs an enable signal EN.

Logic low monitor block 15 tracks logic low pulse P2. Pulse P2 is shown to end while faster linear voltage ramp 45 and slower linear voltage ramp 41 both have a comparison value of 1. This indicates that P2 terminated within its preferred transition window and therefore also receives a status of G, indicating a "good pulse cycle". Flag generator 19 receives this G status and compares it with the status of previous pulse P1. Since both current pulse P2 and previous pulse P1 have a G status, flag generator again issues an enable signal EN.

Logic high pulse P3 is shown to end while slower linear voltage ramp 31 has a comparison value of 1, but faster linear voltage ramp 35 has a comparison value of 0. P3 therefore terminated before it reached its preferred transition region. Logic high monitor block 11 therefore categorizes it as a "bad pulse cycle" and gives it a status B. Upon receiving the status B result from monitor block 11, flag generator 19 issues a disable signal DIS.

Logic low monitor block 15 then observes the next pulse, P4. By the time pulse P4 ends, slower linear voltage ramp 41 has already risen above Vref and obtained a comparison value of 0. Since slower linear voltage 41 and faster linear voltage ramp 45 do not both have a comparison value of 1 when P4 ends, logic low monitor block 15 determines that P4 did not terminate within it s preferred transition window and gives it a B status indicating a "bad pulse cycle". Upon receiving the status B result from monitor block 15, flag generator 19 issues a disable signal DIS.

Logic high pulse P5 is shown to transition within its preferred transition region, as determined by linear voltage ramps 35 and 31. Logic high monitor block 11 therefore categorizes its as a "good pulse cycle" and gives it a good status, G. Flag generator 19 receives this G status and compares it with the status of the immediately previous pulse, P4. Since P4 had a bad, B, status, flag generator 19 issues a disable signal DIS on its output in spite of the current pulse, P5, being a good pulse. This is because in the currently preferred embodiment, flag generator 19 does not issue an enable signal until it receives two consecutive good CKLin pulses.

As shown, logic low pulse P6 also receives a good status, G, by logic low monitor block 15. Again, this is because P6 transitioned within its preferred transition region denoted by the shaded area. Flag generator 19 receives the G status from pulse P6 and compares it with the status of the immediately previous pulse, P5. Since both the current P6 pulse and previous P5 pulse both have a G status, flag generator 19 issues an enable signal EN on its output. The same is case for pulse P7, which receives a G status from logic high monitor block 11 for transition during a time when both linear voltage ramps 35 and 31 have a comparison value of b 1. Flag generator 19 compares pulse P7 with pulse P6, and since both have a G status, flag generator 19 maintains its enable signal EN on its output.

Figure 6:
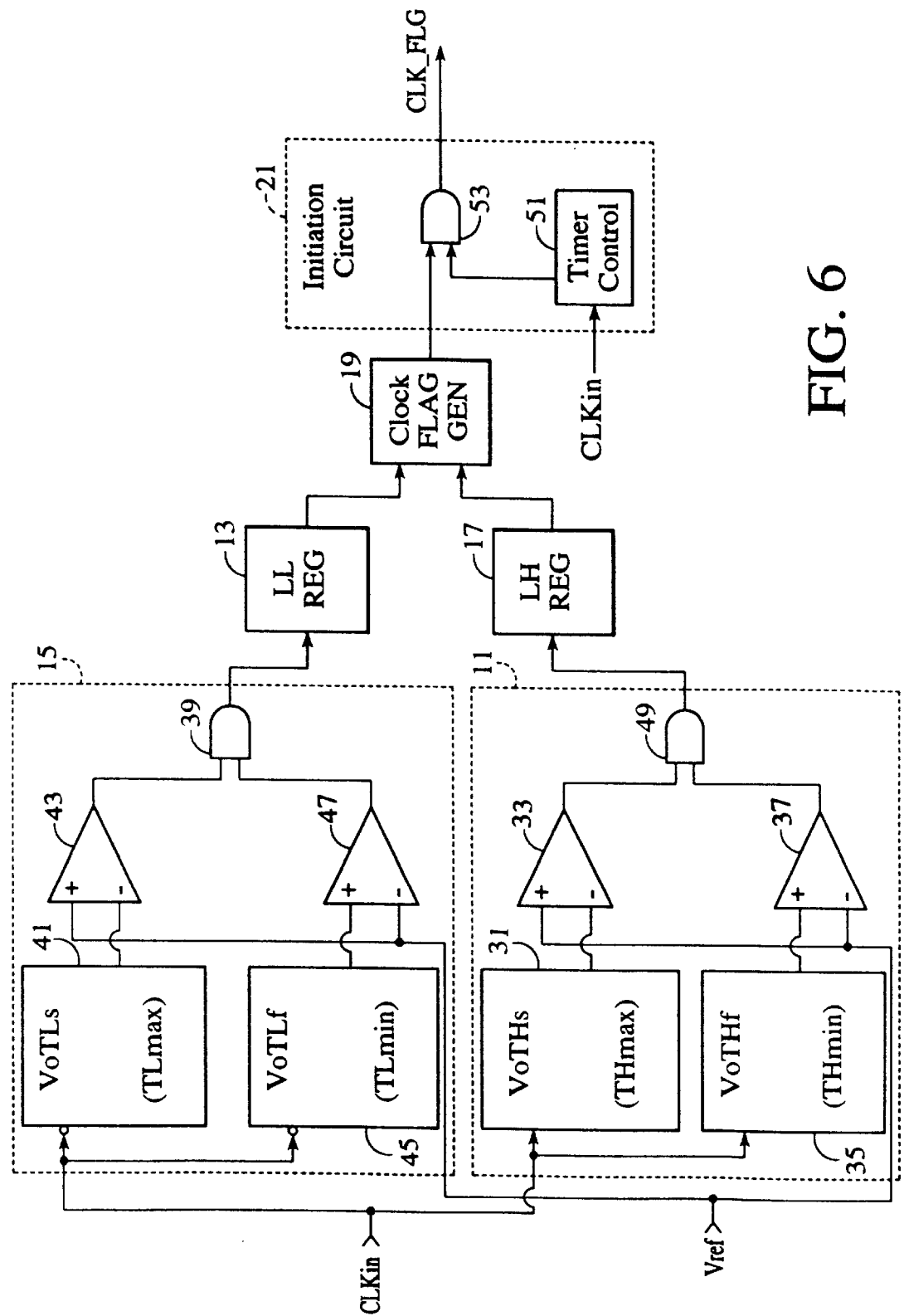
FIG. 6 is a more detailed functional diagram of a pulse monitoring circuit in accord with the present invention.

With reference to FIG. 6, a first circuit implementation of the block diagram of FIG. 4 is shown. All elements in FIG. 6 similar to those of FIG. 4 are identified with similar reference characters and are described above. It is to be understood that there are many implementations for the functional block diagram of FIG. 4, and that the structure shown in FIG. 6 a currently preferred embodiment and does not limit the present invention. If desired, for example, the linear voltage ramps within monitor blocks 11 could be represented by a digital counter and the functional block diagram of FIG. 4 implemented in software, in a programmable logic device, FPGA, or other rendering method known in the art.

Logic high monitoring block 11 includes a faster linear voltage ramp generator 35 and a slower linear voltage ramp generator 31. The output voltage ramp from slower voltage ramp generator 31 has a lower slope than the output from faster linear voltage ramp generator 35. Both linear voltage ramp generators 31 and 35 are preferably active high devices and respond to a logic high pulse on input signal CLKin by initiating their respective output voltage ramps. The output from linear voltage ramp 31 is applied to the inverting input a first differential amplifier 33. The non-inverting input of differential amplifier 33 receives input reference voltage Vref. Differential amplifier 33 will therefore maintain a logic high output until the output from slower linear voltage ramp 31 rises above Vref. At that point the output from differential amplifier 33 will switch to a logic low. By contrast, the output of faster linear voltage ramp generator 35 is applied to the non inverting input of a second differential amplifier 37, and Vref is applied to the inverting input of differential amplifier 37. The output of differential amplifier 37 will therefore remain at a logic low until the output from faster linear voltage ramp 35 rises above Vref. At that point, the output from differential amplifier 37 will switch to a logic high. As explained above, the preferred transition region is denoted by the time period during which the output from slower linear voltage ramp 31 is below Vref and the output from faster linear voltage ramp is above Vref. Under these conditions, the output from first differential amplifier 33 and second differential amplifier 37 both have a logic high output simultaneously. An AND gate 39 issues a logic high when both differential amplifiers 33 and 37 have an logic high output, indicating that the observed pulse is within it preferred transition region.

The structure of logic low monitor block 15 is similar to that of monitor block 11 with only minor changes. In case of logic low monitor block 15, a slower linear voltage ramp generator 41 and a faster linear voltage ramp generator 45 are active low devices and respond to a logic low pulse at input CLKin. When CLKin switches to a logic low pulse, both the faster and slower linear voltage ramp generators 41 and 45 respond by producing their respective output voltage ramps. The output slow of the slower voltage ramp generator 45 is lower than the slow of the faster linear voltage ramp generator 41. The output of slower voltage ramp generator 41 is applied to the inverting input of a third differential amplifier 43, and input reference voltage Vref is applied to the non-inverting input of differential amplifier 43. The differential amplifier 43 will issue a logic high until the output from slower linear voltage ramp 41 rises above Vref. On the other hand, the output from faster linear voltage ramp 45 is applied to the non-inverting input of a fourth differential amplifier 47 and Vref is applied to its inverting input. Differential amplifier 47 will therefore issue a logic low until the output from faster linear voltage ramp generator 41 rises above Vref. The preferred transition window is define by the time period during which both differential amplifiers 43 and 47 simultaneously have a logic high output. A second AND gate 49 determines when both differential amplifiers 43 and 47 have a logic high output.

The resultant output from AND gates 39 and 49 are preferably sent to respective memory devices 13 and 17, implemented as registers in the presently preferred embodiment. If it is not necessary that the current pulse be compared with the previous pulse, however, then memory devices 13 and 17 are not necessary. Flag generator 19 receives the output from logic low register memory 13 and from logic high register memory 17, and compares the current pulse results with the previous pulse results. Flag generator 19 preferably issues an enable signal EN in response to CLKin having two consecutive pulses that transitioned within their respective preferred transition region.

The output from flag generator 19 is preferably applied to an initiation circuit 21, which masks out output from flag generator 19 during a start-up period and replaces it with a disable signal DIS. In the present embodiment, a logic high on output signal CLK_FLG represents an enable signal EN and logic low on CLK_FLG represents disable signal DIS. An AND gate 53 selectively masks the output from Flag generator 19 for a predetermined amount of time or a predetermined number of pulses on signal CLKin. A time control circuit 51 determines when to mask the output from flag generator 19.

Figure 7:
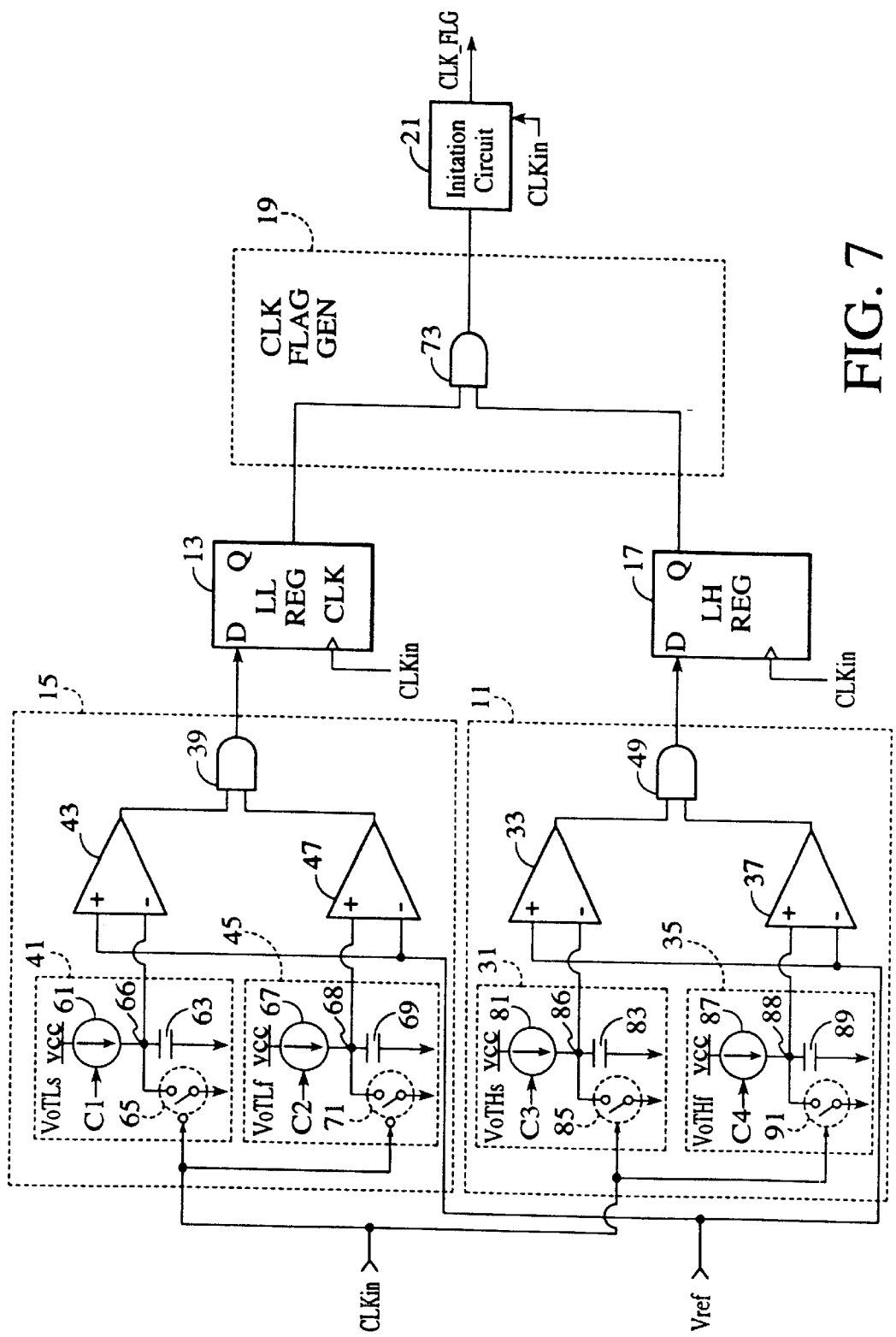
FIG. 7 is a circuit implementation of the present invention.

FIG. 7 offers a more detailed circuit level implementation of the structures of FIGS. 4 and 6. All elements similar to those of FIGS. 4 and 6 have similar reference characters and are described above. Faster and slower linear voltage ramp generators 31 and 35 may have a similar implementation. For example, each has a respective constant current source 61 and 67 that can selectively charge a respective capacitive means 63 and 68. The output of each linear voltage ramp generator is taken at respective junctions 66 and 68 joining their respective constant current sources and capacitive means. The slop of a an output voltage ramp at either of junctions 66 or 68 is determined by the strength of their respective current source 61/67 and the capacitance of their respective capacitive means 63/68. Assuming that the capacitance of capacitive means 63 and 69, the ramp rate of nodes 66 and 68 may be adjusted by altering the strength of respective constant current sources 61 and 67. In the present example, the strength of constant current sources 61 and 67 is controlled by respective control signals C1 and C2. Thus, one can adjust the difference in ramp rate at nodes 66 and 68, and thereby adjust W0, by adjusting control lines C1 and C2. This offers another degree of freedom since one can now adjust the size of the preferred transition window either by changing Vref or by changing C1 and C2.

A fist switch 65 can selectively reset the voltage potential at node 66. Similarly, a second switch 71 can selectively reset the voltage potential at node 68. Since linear voltage ramps 31 and 35 are intended to respond to a logic low pulse at CLKin, switches 65 and 66 are shown as active low devices responsive to a logic low input.

Linear voltage ramps 41 and 45 of logic high monitor block 11 are shown to have substantially the same structure as linear voltage ramps 31 and 35 of logic low monitor block 15. The basic differences is that linear voltage ramps 41 and 45 are shown responsive to a second pair of respective current control signals C3 and C4, and switches 85 and 91 are shown as active high devices. Therefore, switches 85 and 91 would respond to a logic high at CLKin and permit monitor block 11 to track positive pulses at CLKin.

Memory registers 13 and 17 are shown implemented as D flip-flops clocked by CKLin. This permits them to latch the result of their respective AND gate input, 36 and 49, at the point when CLKin transitions. For example, If logic low monitor block 15 is tracking a logic low pulse at CLKin, the output from AND gate 39 will change with time from a logic low to a logic high as the length of the logic low CLKin pulse enters its preferred transition region. If the length of the logic low CLKin pulse persists pass its preferred transition region, then AND gate 39 would again changed from a logic high to a logic low. Having logic low register 13 clocked on the logic low to logic high pulse transition of CLKin allows register 13 to latch the current state of AND gate 39. Similarly, logic high register 17 is clocked on the logic low transition of CLKin in order to latch in the state of AND gate 49 when a monitored logic high CLKin pulse transitions to a logic low. Thus, one of memory registers 13 and 17 will also have the status of a current CLKin pulse and the other will have the status of the previous CLKin pulse. Since a good status G is represented by a logic high and bad status B is represented by a logic low, a current good CLKin pulse following a previous good CLKin pulse is represented when both memory registers 13 and 17 have a logic high at their respective outputs. Flag generator 19 is represented by an AND gate 73 and will issue a logic high enable signal EN only when both memory registers 13 and 17 have logic high output, and will issue a logic low disable signal DIS otherwise.

What is claimed is:

1. A pulse monitoring circuit for recognizing pulse duration within a predetermined time range comprising:
   first pulse detecting device having:
      a logic signal input node for receiving a logic signal alternating between a first logic state pulse and a second logic state pulse;
      a first voltage ramp generator coupled to said logic signal input node for producing a first linear voltage ramp upon reception of said first logic state pulse;
      a second voltage ramp generator coupled to said logic signal input node for producing a second linear voltage ramp upon reception of said first logic state pulse;
      a reference voltage input node for receiving a reference voltage;
      a first voltage level detecting means having a first input node coupled to said reference voltage input node and having a second input node coupled to receive said first linear voltage ramp, said first voltage level detecting means being effective for issuing a first detection signal in response to said first linear voltage ramp having a potential below said reference voltage;
      a second voltage level detecting means having a first input node coupled to said reference voltage input node and having a second input node coupled to receive said second linear voltage ramp, said second voltage level detecting means being effective for issuing a second detection signal in response to said second linear voltage ramp having a potential above said reference voltage;
      a control means coupled to said first and second voltage level detecting means for determining when said first detection signal is coincident with said second detection signal.

2. The pulse monitoring circuit of claim 1 wherein said second linear voltage ramp has a greater slope than said first linear voltage ramp.

3. The pulse monitoring circuit of claim 1 wherein said reference voltage is proportional to a measure of time, the voltage difference between said second linear voltage ramp and said first linear voltage ramp is proportional to the pulse duration of said first logic state pulse, said predetermined time range being defined by the time period during which said first detection signal is coincident with said second detection signal.

4. The pulse monitoring circuit of claim 1 wherein said first pulse detecting device further includes a first memory means for storing the output of said control means.

5. The pulse monitoring circuit of claim 4 wherein said first memory means stores the output of said first control means in response to removal of said first logic state pulse.

6. The pulse monitoring circuit of claim 1 further having a second pulse detecting device effective for determining when the pulse length of said second logic state pulse is within a second time range.

7. The pulse monitoring circuit of claim 6 further having a flag generator coupled to said first pulse detecting device and to said second pulse detecting device, said flag generator being effecting for issuing an enable flag signal in response to consecutive first and second logic state pulses being within their respective predetermined time ranges as determined by their respective first and second pulse detecting devices.

8. The pulse monitoring circuit of claim 7 wherein the issuance of said enable flag signal is synchronous with a logic state change at said logic input node.

9. The pulse monitoring circuit of claim 7 further having first and second memory means, said first memory means being coupled to receive the output of said first pulse detecting device and being effective for storing the output of said control means, said second memory means being coupled to store the output of said second pulse detecting device.

10. The pulse monitoring circuit of claim 9 wherein said first memory means stores the output of said control means in response to removal of said first logic state pulse.

11. The pulse monitoring circuit of claim 9 wherein the stored output of said first and second memory means are coupled to said flag generator.

12. The pulse monitoring circuit of claim 11 further having an initiation setup timer coupled to receive the output of said flag generator, said initiation setup timer being effective for selectively transferring one of a disable signal and the output of said flag generator to an enable output node, said initiation setup timer being effective for transferring said disable signal to said enable output node for a predetermined number of logic state pulses at said logic signal input node in response to an initial stream of logic state pulses at said logic signal input node.

13. The pulse monitoring circuit of claim 12 further being effective for transferring said disable signal to said enable output in response to an absence of logic state change at said logic signal input node for a predetermined amount of time.

14. The pulse monitoring circuit of claim 9 wherein said first and second memory means are digital registers.

15. The pulse monitoring circuit of claim 6 wherein said second pulse detecting device includes:
   a third voltage ramp generator coupled to said logic signal input node for producing a third linear voltage ramp upon reception said second logic state pulse at said input node;
   a fourth voltage ramp generator coupled to said logic signal input node for producing a fourth linear voltage ramp upon reception of said second logic state pulse at said input node, said fourth linear voltage ramp having a greater slope than said third linear voltage ramp;
   a second reference voltage input node for receiving said reference voltage;
   a third voltage level detecting means having a first input node coupled to said second reference voltage input node and having a second input node coupled to receive said third linear voltage ramp, said third voltage level detecting means being effective for issuing a third detection signal in response to said third linear voltage ramp having a potential below said reference voltage;
   a fourth voltage level detecting means having a first input node coupled to said second reference voltage input node and having a second input node coupled to receive said fourth linear voltage ramp, said fourth voltage level detecting means being effective for issuing a fourth detection signal in response to said fourth linear voltage ramp having a potential above said reference voltage;
   a second control means coupled to said third voltage level detecting means and coupled to said fourth voltage level detecting means for determining when said third detection signal is coincident with said fourth detection signal.

16. The pulse monitoring circuit of claim 15 wherein the difference between the slopes of said first and second voltage ramp generators is different than the voltage difference between the slopes of said third and fourth voltage ramp generators.

17. The pulse monitoring circuit of claim 16 wherein said first, second, third, and fourth voltage level detecting means are differential amplifiers.

18. The pulse monitoring circuit of claim 1 wherein said first voltage detecting means is a differential amplifier.

19. The pulse monitoring circuit of claim 1 wherein said first and second voltage ramp generators are reset prior to generating said first and second linear voltage ramps.

20. The pulse monitoring circuit of claim 1 further having a first slope control node coupled to said first voltage ramp generator, said slope control node being effective for changing the slope of the output voltage ramp of said first voltage ramp output.

21. The pulse monitoring circuit of claim 20 further having a second slope control node coupled to said second voltage ramp generator, said second slope control node being effective for changing the slope of the output voltage ramp of said second voltage ramp generator, said second slope control node being independent of said first slope control node.

22. A pulse monitoring circuit for monitoring a first logic state pulse and a second logic state pulse comprising:
a first pulse detecting device for monitoring said first logic state pulse and a second pulse detecting device for monitoring said second logic state pulse;
a logic signal input node for receiving a logic signal alternating between said first logic state pulse and said second logic state pulse;
a reference voltage input node for receiving a reference voltage;
said first pulse detecting device including:
a first voltage ramp generator coupled to said logic signal input node for producing a first linear voltage ramp upon reception of said first logic state pulse;
a second voltage ramp generator coupled to said logic signal input node for producing a second linear voltage ramp upon reception of said first logic state pulse;
a first voltage level detecting means having a first input node coupled to said reference voltage input node and having a second input node coupled to receive said first linear voltage ramp, said first voltage level detecting means being effective for issuing a first detection signal in response to said first linear voltage ramp having a potential below said reference voltage;
a second voltage level detecting means having a first input node coupled to said reference voltage input node and having a second input node coupled to receive said second linear voltage ramp, said second voltage level detecting means being effective for issuing a second detection signal in response to said second linear voltage ramp having a potential above said reference voltage;
a first decoding means coupled to said first and second voltage level detecting means effective for issuing a first good status signal in response to said first detection signal being coincident with said second detection signal;

said second pulse detecting device including:
a third voltage ramp generator coupled to said logic signal input node for producing a third linear voltage ramp upon reception said second logic state pulse at said input node;
a fourth voltage ramp generator coupled to said logic signal input node for producing a fourth linear voltage ramp upon reception of said second logic state pulse at said input node;
a third voltage level detecting means having a first input node coupled to said reference voltage input node and having a second input node coupled to receive said third linear voltage ramp, said third voltage level detecting means being effective for issuing a third detection signal in response to said third linear voltage ramp having a potential below said reference voltage;
a fourth voltage level detecting means having a first input node coupled to said reference voltage input node and having a second input node coupled to receive said fourth linear voltage ramp, said fourth voltage level detecting means being effective for issuing a fourth detection signal in response to said fourth linear voltage ramp having a potential above said reference voltage;
a second decoding means coupled to said third and fourth voltage level detecting means effective for issuing a second good status signal in response to said third detection signal being coincident with said fourth detection signal, and;
a flag generator coupled to said first and second decoding means, said flag generator being effecting for issuing an enable flag signal in response to said first good status signal being coincident with said second good status signal.

23. The pulse monitoring circuit of claim 22 wherein said second linear voltage ramp has a greater slope than said first linear voltage ramp.

24. The pulse monitoring circuit of claim 22 wherein the difference between the slopes of said first and second voltage ramp generators is different than the voltage difference between the slopes of said third and fourth voltage ramp generators.

25. The pulse monitoring circuit of claim 22 wherein said first, second, third, and fourth voltage level detecting means are differential amplifiers.

26. The pulse monitoring circuit of claim 22 wherein said first and second voltage ramp generators are reset prior to generating said first and second linear voltage ramps.

27. The pulse monitoring circuit of claim 22 further having a first memory means for storing the output of said first decoding means and having a second memory means for storing the output of said second decoding means.

28. The pulse monitoring circuit of claim 27 wherein said first memory means stores the output of said first decoding means in response to removal of said first logic state pulse and said second memory means stores the output of said second decoding means in response to removal of said second logic state pulse.

29. The pulse monitoring circuit of claim 22 wherein the issuance of said enable flag signal is synchronous with a logic state change at said logic input node.

30. The pulse monitoring circuit of claim 27 wherein said first and second memory means are digital registers.

31. The pulse monitoring circuit of claim 28 wherein the stored output of said first and second memory means are coupled to said flag generator.

32. The pulse monitoring circuit of claim 31 further having an initiation setup timer coupled to receive the output of said flag generator, said initiation setup timer being effective for selectively transferring one of a disable signal and the output of said flag generator to an enable output node, said initiation setup timer being effective for transferring said disable signal to said enable output node for a predetermined number of logic state pulses at said logic signal input node in response to an initial stream of logic state pulses at said logic signal input node.

33. The pulse monitoring circuit of claim 32 further being effective for transferring said disable signal to said enable output in response to an absence of logic state change at said logic signal input node for a predetermined amount of time.

34. A pulse monitoring circuit for determining when a first logic state pulse lies within a first predetermined time window and a second logic state pulse lies within a second predetermined time window comprising:
- a first pulse detecting device for monitoring said first logic state logic pulse and a second pulse detecting device for monitoring said second logic state pulse;
- a logic signal input node for receiving a logic signal alternating between said first logic state pulse and said second logic state pulse;
- a reference voltage input node for receiving a reference voltage,
- said first pulse detecting device including:
  - a first voltage ramp generator coupled to said logic signal input node and responsive to said first logic state pulse;
  - a second voltage ramp generator coupled to said logic signal input node and responsive to said first logic state pulse;
  - a first voltage level detecting means having a first input node coupled to said reference voltage input node and having a second input node coupled said first voltage ramp generator, said first voltage level detecting means being effective for issuing a first detection signal in response to said first voltage ramp generator having an output potential below said reference voltage;
  - a second voltage level detecting means having a first input node coupled to said reference voltage input node and having a second input node coupled said second voltage ramp generator, said second voltage level detecting means being effective for issuing a second detection signal in response to said second voltage ramp generator having an output potential above said reference voltage;
  - a first decoding means coupled to said first and second voltage level detecting means for determining when said first detection signal is coincident with said second detection signal;

Said second pulse detecting device including:
- a third voltage ramp generator coupled to said logic signal input node and responsive to said second logic state pulse at said input node;
- a fourth voltage ramp generator coupled to said logic signal input node and responsive to said second logic state pulse at said input node;
- a third voltage level detecting means having a first input node coupled to said reference voltage input node and having a second input node coupled to said third voltage ramp generator, said third voltage level detecting means being effective for issuing a third detection signal in response to said third voltage ramp generator having an output potential below said reference voltage;
- a fourth voltage level detecting means having a first input node coupled to said reference voltage input node and having a second input node coupled to said fourth voltage ramp generator, said fourth voltage level detecting means being effective for issuing a fourth detection signal in response to said fourth voltage ramp generator having an output potential above said reference voltage;
- a second decoding means coupled to said third and fourth voltage level detecting means for determining when said third detection signal is coincident with said fourth detection signal, and;
- a flag generator coupled to said first and second decoding means, said flag generator being effecting for issuing an enable flag signal in response to said third detection signal being coincident with said fourth detection signal and said first detection signal being coincident with said second detection signal.

35. The pulse monitoring circuit of claim 34 wherein said first and second voltage ramp generators produce first linear voltage ramp outputs.

36. The pulse monitoring circuit of claim 34 further having a first memory means for storing the output of said first decoding means and having a second memory means for storing the output of said second decoding means.

37. The pulse monitoring circuit of claim 36 wherein said first memory means stores the output of said first decoding means in response to removal of said first logic state pulse and said second memory means stores the output of said second decoding means in response to removal of said second logic state pulse.

38. The pulse monitoring circuit of claim 36 wherein said first and second memory means are digital registers.

39. The pulse monitoring circuit of claim 36 wherein the issuance of said enable flag signal is synchronous with a logic state change at said logic input node.

40. The pulse monitoring circuit of claim 36 wherein said second voltage ramp generator has a greater rise time than said first voltage ramp generator.

41. The pulse monitoring circuit of claim 36 wherein said first, second, third, and fourth voltage level detecting means are differential amplifiers.

42. The pulse monitoring circuit of claim 36 wherein said first predetermined time window is defined by the time period during which said first detection signal is coincident with said second detection signal, and said second predetermined time window is defined by the time period during which said third detection signal is coincident with said fourth detection signal.

43. The pulse monitoring circuit of claim 36 further having an initiation setup timer coupled to receive the output of said flag generator, said initiation setup timer being effective for selectively transferring one of a disable signal and the output of said flag generator to an enable output node, said initiation setup timer being effective for transferring said disable signal to said enable output node for a predetermined number of logic state pulses at said logic signal input node in response to an initial stream of logic state pulses at said logic signal input node.

44. The pulse monitoring circuit of claim 43 further being effective for transferring said disable signal to said enable output in response to an absence of logic state change at said logic signal input node for a predetermined amount of time.

\* \* \* \* \*